United States Patent
Ferry et al.

(10) Patent No.: US 6,197,111 B1
(45) Date of Patent: Mar. 6, 2001

(54) HEAT SHIELD ASSEMBLY FOR CRYSTAL PULLER

(75) Inventors: Lee Ferry, St. Charles; Yasuhiro Ishii, St. Louis, both of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/258,478

(22) Filed: Feb. 26, 1999

(51) Int. Cl.⁷ ........................................... C30B 27/02
(52) U.S. Cl. ....................................................... 117/217
(58) Field of Search ............................. 117/200, 206, 117/208, 217, 213

(56) References Cited

U.S. PATENT DOCUMENTS

| | | | |
|---|---|---|---|
| 4,854,959 | 8/1989 | Waltert | 65/335 |
| 4,981,549 | 1/1991 | Yamashita et al. | 156/620 |
| 5,138,179 | 8/1992 | Baba et al. | 250/560 |
| 5,183,528 | 2/1993 | Baba et al. | 156/601 |
| 5,248,378 | 9/1993 | Oda et al. | 156/617 |
| 5,264,189 | 11/1993 | Yamashita et al. | 422/249 |
| 5,316,742 * | 5/1994 | Tomioka et al. | 117/217 |
| 5,363,796 * | 11/1994 | Kobayashi et al. | 117/30 |
| 5,414,927 * | 5/1995 | Fiel et al. | 29/825 |
| 5,437,242 | 8/1995 | Hofstetter et al. | 117/14 |
| 5,441,014 * | 8/1995 | Tomioka et al. | 117/213 |
| 5,443,034 | 8/1995 | Evert | 117/208 |
| 5,567,399 * | 10/1996 | Von Ammon et al. | 722/245.1 |
| 5,824,152 * | 10/1998 | Kubota et al. | 117/217 |
| 5,868,836 * | 2/1999 | Nakamura et al. | 117/208 |
| 5,922,127 | 7/1999 | Luter et al. | 117/217 |
| 5,942,032 * | 8/1999 | Kim et al. | 117/13 |
| 5,954,875 * | 9/1999 | Kato et al. | 117/217 |

FOREIGN PATENT DOCUMENTS

| | | |
|---|---|---|
| 0450502A1 | 10/1991 | (EP) . |
| 0591525A1 | 4/1994 | (EP) . |
| 0867531A1 | 9/1998 | (EP) . |
| 03153595 | 7/1991 | (JP) . |
| 2709310B2 | 7/1991 | (JP) . |
| 3177389 | 8/1991 | (JP) . |
| 04059689 | 2/1992 | (JP) . |
| 7-033587 | 2/1995 | (JP) . |
| 8-091980 | 4/1996 | (JP) . |

OTHER PUBLICATIONS

PCT International Search Report, Jun. 16, 2000.

* cited by examiner

*Primary Examiner*—Benjamin L. Utech
*Assistant Examiner*—Matthew Anderson
(74) *Attorney, Agent, or Firm*—Senniger, Powers, Leavitt & Roedel

(57) ABSTRACT

A heat shield for a crystal puller including an inner and an outer reflector. The inner and outer reflectors are spaced from each other an have reduced surface area in which they contact each other. Improved heat shielding of a growing crystal ingot reduces defects and permits a greater throughput of ingots produced by the crystal puller.

13 Claims, 2 Drawing Sheets

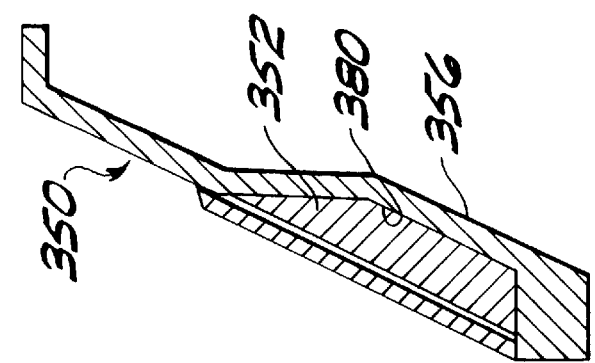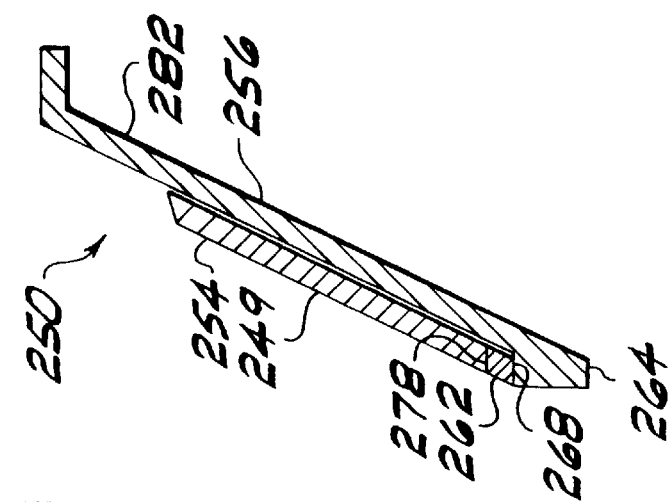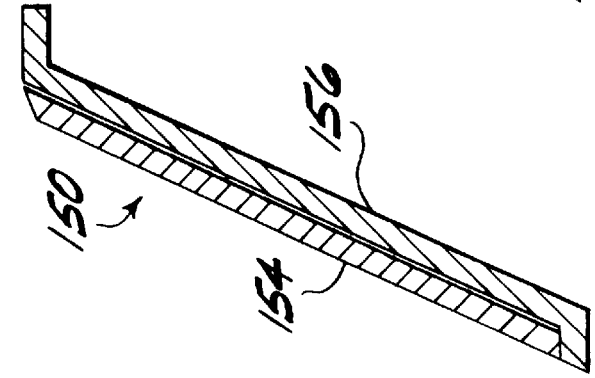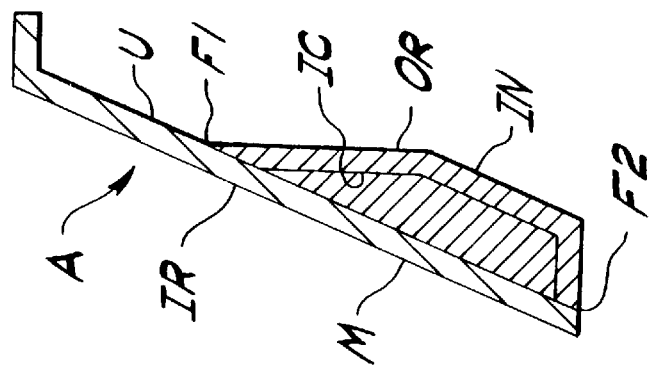

HEAT SHIELD ASSEMBLY FOR CRYSTAL PULLER

Background of the Invention

The present invention relates to a crystal puller for growing single crystal semiconductor material, and more particularly to a heat shield assembly for use in such crystal pullers.

Single crystal semiconductor material, which is the starting material for fabricating many electronic components, is commonly prepared using the Czochralski ("Cz") method. In this method, polycrystalline semiconductor source material such as polycrystalline silicon ("polysilicon") is melted in a crucible. Then a seed crystal is lowered into the molten material and slowly raised to grow a single crystal ingot. As the ingot is grown, an upper end cone is formed by decreasing the pull rate and/or the melt temperature, thereby enlarging the ingot diameter, until a target diameter is reached. Once the target diameter is reached, the cylindrical main body of the ingot is formed by controlling the pull rate and the melt temperature to compensate for the decreasing melt level. Near the end of the growth process but before the crucible becomes empty, the ingot diameter is reduced to form a lower end cone which is separated from the melt to produce a finished ingot of semiconductor material.

Although the conventional Cz method is satisfactory for growing single crystal semiconductor materials for use in a wide variety of applications, further improvement in the quality of semiconductor material is desirable. For instance, as semiconductor manufacturers reduce the width of integrated circuit lines formed on semiconductors, the presence of microscopic defects in the material becomes of greater concern. Defects in single crystal semiconductor materials form as the crystals solidify and cool in the crystal puller. Such defects arise, in part, because of the presence of an excess (i.e., a concentration above the solubility limit) of intrinsic point defects known as vacancies and interstitials.

One important measurement of the quality of wafers sliced from a single-crystal ingot is Gate Oxide Integrity ("GOI"). Vacancies, as their name suggests, are caused by the absence or "vacancy" of a silicon atom in the crystal lattice. When the crystal is pulled upward from the molten silicon in the crucible, it immediately begins to cool. As the temperature of the crystal ingot decreases, the solubility limit decreases.

Point defects that are present at high temperatures then precipitate out in the form of microscopic defects (voids), or they move to the lateral surface of the crystal. This generally happens as the crystal descends through the temperature range of 1150° C. to 1500° C.

Silicon wafers sliced from the ingot and manufactured according to conventional processes often include a silicon oxide layer formed on the surface of the wafer. Electronic circuit devices such as MOS devices are fabricated on this silicon oxide layer. Defects in the surface of the wafer, caused by the agglomerations present in the growing crystal, lead to poor growth of the oxide layer. The quality of the oxide layer, often referred to as the oxide film dielectric breakdown strength, may be quantitatively measured by fabricating MOS devices on the oxide layer and testing the devices. The Gate Oxide Integrity (GOI) of the crystal is the percentage of operational devices on the oxide layer of the wafers processed from the crystal.

It has been determined that the GOI of crystals grown by the Czochralski method can be improved by increasing the amount of time a growing ingot dwells in the temperature range above 1000° C., and more particularly in the range of 1150° C.–1050° C. If the ingot cools too quickly through this temperature range, the vacancies will not have sufficient time to agglomerate together, resulting in a large number of small agglomerations within the ingot. This undesirably leads to a large number of small voids spread over the surfaces of the wafer, thereby negatively affecting GOI. Slowing down the cooling rate of the ingot so that its temperature dwells in the target temperature range for a longer period of time allows more vacancies to form larger agglomerations within the ingot. The result is a small number of large agglomerations, thereby improving GOI by decreasing the number of defects present in the surface of the wafer upon which the MOS devices are formed.

Another way to improve GOI is to control the number of vacancies grown into the ingot. It is understood that the type and initial concentration of vacancies and self-interstitials, which become fixed in the ingot as the ingot solidifies, are controlled by the ratio of the growth velocity (i.e., the pull rate) (v) to the local axial temperature gradient in the ingot at the time of solidification ($G_o$). When the value of this ratio ($v/G_o$) exceeds a critical value, the concentration of vacancies increases. Likewise, when the value of $v/G_o$ falls below the critical value, the concentration of self-interstitials increases.

One way to increase this ratio is to increase the pull rate (i.e., growth velocity, v) of the ingot. However, an increase in pull rate will cause distortion in the diameter of the ingot if the ingot is given sufficient time to cool and solidify. To this end, it is known to position a heat shield assembly within the crucible above the melt surface between the crucible side wall and the growing ingot for shielding the ingot from the heat of the crucible side wall. The conventional heat shield assembly typically includes an outer reflector and an inner reflector. A schematic cross section of the wall of a conventional heat shield is shown in FIG. 2. The outer reflector OR is secured to the inner reflector IR by suitable fasteners (not shown) spaced along annular upper and lower fastener locations so that the outer reflector directly contacts the inner reflector at these locations. The outer reflector OR is substantially shorter than the inner reflector IR so that an upper portion of the heat shield assembly comprises a single, uninsulated layer. The reflectors OR, IR are shaped to define an insulating chamber therebetween containing insulation IN for inhibiting heat transfer from the outer reflector to the inner reflector.

The insulation I is intended to insulate a midportion M of the inner reflector IR against heat transfer from the outer reflector OR so that heat from the crucible wall is not transferred to the inner reflector. Providing a cooler portion of the inner reflector IR permits quicker cooling of the ingot as the ingot is pulled upward into radial registration with that portion of the heat shield. However, because of the large surface area contact between the outer reflector OR and inner reflector IR at the upper and lower fastener locations, a substantial amount of heat from the outer reflector is undesirably conducted directly to the inner reflector such that the inner reflector is not cooled as well as desired. This substantially limits the pull rate of the growing ingot.

An additional measurement of the quality of the wafers sliced from a crystal ingot relates to Oxygen Induced Stacking Faults (OISF). OISF results from defects being grown into the ingot as the ingot solidifies at the melt surface. The defects are a result of a differential between the axial temperature gradients at the center of the ingot and the outer surface of the ingot. OISF is measured as a ring spaced some distance inward from the peripheral edge of a wafer.

The concentration of stacking faults within a particular area of the wafer surface may also be measured. The gradient at the interface varies with r, which leads to varying concentrations of point defects. Thus, by choosing the appropriate pull rate concentrations can be achieved, resulting in better OISF performance.

SUMMARY OF THE INVENTION

Among the several objects and features of the present invention may be noted the provision of a heat shield assembly and a crystal puller which facilitate growth of high quality single crystal ingots; the provision of such a heat shield assembly and crystal puller which reduce the radial variation in the axial temperature gradient of the crystal; the provision of such a heat shield assembly and crystal puller having a faster pull rate, thereby increasing the throughput of the crystal puller; the provision of such a heat shield assembly and crystal puller which improves GOI and inhibits the growth of OISF; the provision of such a heat shield assembly which is capable of operating in a confined space within a crystal puller; and the provision of such a heat shield assembly which is readily adapted to existing crystal pullers.

In general, a heat shield assembly for use in a crystal puller comprises an outer reflector and an inner reflector. The reflectors are in generally coaxial alignment and have central openings sized and shaped for surrounding the ingot as the ingot is pulled from the molten material. The reflectors are generally interposed between the ingot and the crucible as the ingot is pulled upward from the source material within the crystal puller. The reflectors are shaped to define an insulation chamber therebetween for containing insulation. The inner reflector is supported in the puller in generally spaced relationship with the outer reflector and insulation along at least a portion of the inner reflector to inhibit heat transfer from the outer reflector and insulation to the inner reflector such that the portion of the inner reflector spaced from the outer reflector and insulation is substantially cooler than the outer reflector during operation of the puller.

In another aspect of the invention a crystal puller having a heat shield.

Other objects and features of the present invention will be in part apparent and in part pointed out hereinafter.

BRIEF DESCRIPTION OF THE DRAWINGS

FIG. 2 is a schematic cross-section of a portion of a prior art heat shield assembly;

FIG. 3 is a schematic cross-section of a portion of a second embodiment of a heat shield assembly of the present invention;

FIG. 4 is a schematic cross-section of a portion of a third embodiment of a heat shield assembly of the present invention; and FIG. 5 is a schematic cross-section of a portion of a fourth embodiment of a heat shield assembly of the present invention.

Corresponding reference characters indicate corresponding parts throughout the several views of the drawings.

DETAILED DESCRIPTION OF THE PREFERRED EMBODIMENT

Figure 1:
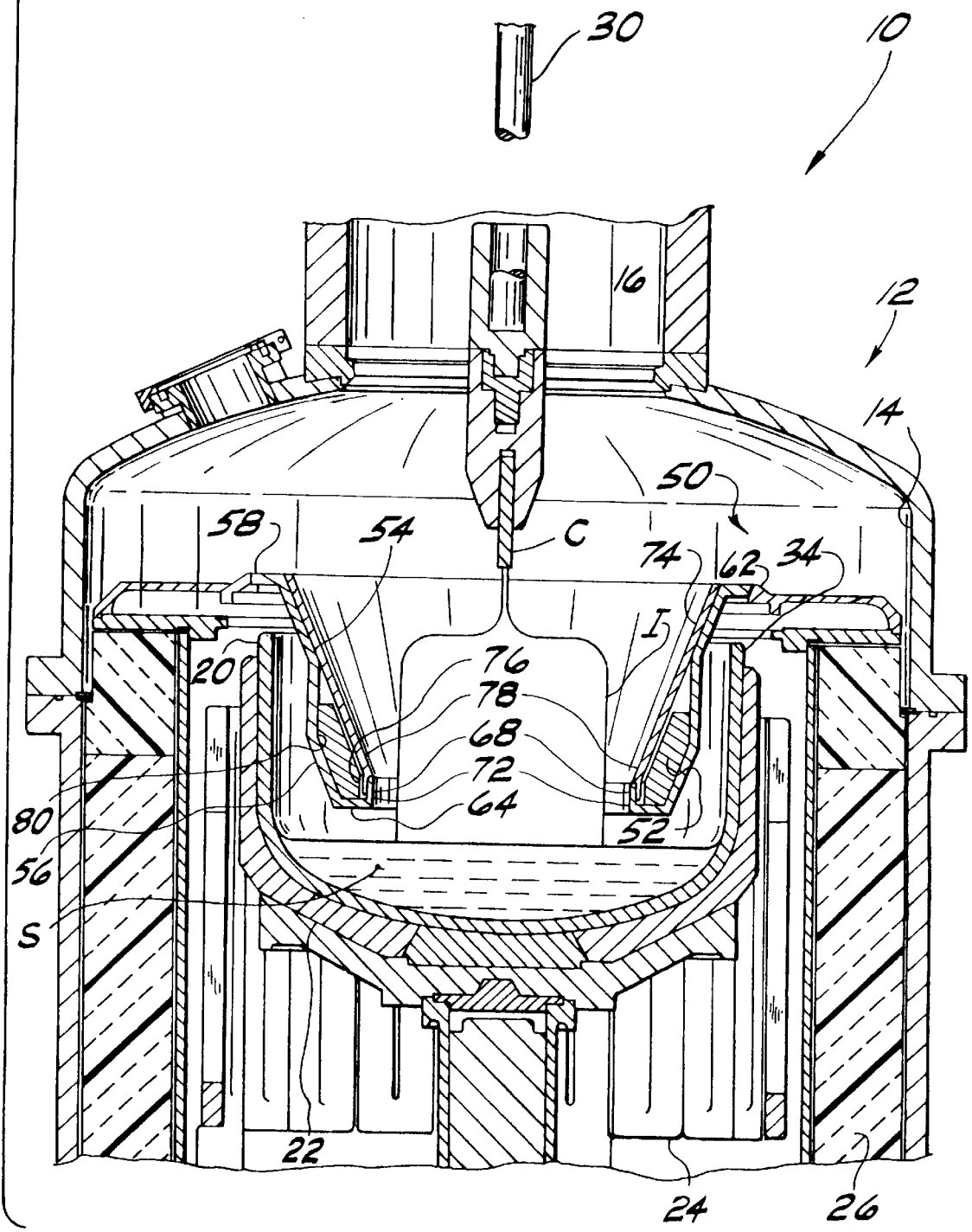
FIG. 1 is a schematic, fragmentary vertical crosssection of a crystal puller, and a heat shield assembly of a first embodiment.

Referring now to the drawings and in particular to FIG. 1, a crystal puller is designated in its entirety by the reference numeral 10. The puller is used to grow monocrystalline ingots I of the type used to manufacture semiconductor wafers. The crystal puller 10 includes a water cooled shell (generally indicated at 12) having an interior which includes a crystal growth chamber 14 and a pull chamber 16 disposed above the growth chamber. A quartz crucible 20 is positioned within the growth chamber 14 for holding molten semiconductor source material S from which the monocrystalline silicon ingot I is grown. The crucible 20 is mounted on a motorized turntable 22 which rotates the crucible about a vertical axis and raises the crucible to maintain the surface of the molten source material S at a constant level as the ingot I grows and source material is removed from the melt.

A resistance heater 24 surrounding the crucible 20 melts the source material S in the crucible 20. The heater 24 is controlled by an external control system (not shown) so that the temperature of the molten source material is precisely controlled throughout the pulling process. Insulation 26 surrounding the heater 24 reduces the amount of heat lost through the sides of the shell 12 and helps to reduce the heat load on the exterior walls of the puller, while allowing process temperatures to be maintained at a lower heater power.

A pulling mechanism (of which only a depending pull shaft 30 is shown in FIG. 1) rotates a seed crystal C and moves it up and down through the growth chamber 14 and the pull chamber 16. First, the pulling mechanism lowers the seed crystal C through the chambers 14, 16 until it contacts the surface of the molten source material S. Once the seed crystal begins to melt, the pulling mechanism slowly raises the seed C through the chambers 14, 16 to grow the monocrystalline ingot I. The speed at which the pulling mechanism 30 rotates the seed C and the speed at which the pulling mechanism raises the seed (i.e., the pull rate v) are controlled by the external control system. The control system also controls the speed at which the crucible 20 moves during the pulling process. The general construction and operation of the crystal puller 10, except to the extent explained more fully below, is conventional and known by those of ordinary skill in the art.

FIG. 2 is a schematic vertical section of one side of a prior art heat shield assembly A adapted for mounting in the growth chamber of the crystal puller to thermally shield the growing ingot from heat radiated by the crucible side wall 34. The prior heat shield assembly A includes an outer reflector OR and an inner reflector IR. The outer reflector OR is secured to the inner reflector IR by suitable fasteners (not shown) such that the outer reflector engages the inner reflector along annular upper and lower fastener locations F1, F2, respectively. The fasteners are not shown in the drawing. The outer reflector OR is substantially shorter than the inner reflector IR so that an upper portion U of the heat shield assembly A comprises a single uninsulated layer. The reflectors OR, IR are shaped to define an insulation chamber IC between them containing insulation IN for inhibiting heat transfer from the outer reflector OR to the inner reflector IR. The assembly A is frustoconical and has a central opening (not shown) sized for surrounding the ingot (not shown) as the ingot is pulled upward through the assembly.

The insulation IN is intended to insulate a portion M of the inner reflector IR against heat transfer from the outer reflector OR so that heat from the crucible side wall 34 (FIG. 1) is inhibited against transfer to the inner reflector. Providing a cooler portion M of the inner reflector IR increases heat transfer away from the ingot as the ingot comes into radial registration with the inner reflector, thereby increasing the cooling rate of the ingot. The heat shield assembly A allows for a faster pull rate without resultant distortion of the growing ingot. However, because of the large surface area contact between the outer reflector OR and inner reflector IR at the upper and lower fastener locations F1, F2, a substantial amount of heat from the outer reflector is undesirably conducted directly to the inner reflector, substantially decreasing the effectiveness of the heat shield assembly A and limiting the pull rate.

Referring back to FIG. 1, a heat shield assembly of the present invention, generally indicated at 50, is mounted in the growth chamber 14 above the surface of the molten source material S. In the illustrated embodiment, the heat shield assembly 50 generally comprises insulation 52 contained between co-axially positioned inner and outer reflectors, 54, 56. The outer reflector 56 is generally conical and has an annular flange 58 extending radially outward from the top of the reflector. The flange 58 is sized for seating over an annular support ring 62 disposed in the growth chamber 14 for supporting the heat shield assembly 50 (FIG. 1). The outer reflector 56 slopes inward and downward from the annular flange 58 and extends down into the crucible 20 to a position above the melt surface so that the outer reflector is at least partially interposed between the crucible side wall 34 and the growing ingot I.

A second, or lower annular flange 64 extends radially inward from a bottom of the outer reflector 56 to define a bottom of the heat shield assembly 50. An annular support ledge 68 extends vertically up from an inner peripheral edge of the lower flange 64 for supporting the inner reflector 54, as will be described further below. The outer reflector 56 is preferably constructed of a graphite material, and more particularly of silicon carbide coated graphite. The outer reflector 56 has a central opening 72 defining a central opening of the heat shield assembly 50. The central opening 72 is sized and shaped for surrounding the ingot I as the ingot is grown and pulled upward in the growth chamber 14 past the heat shield assembly 50. For example, the central opening 72 of the illustrated embodiment is generally circular to accommodate the generally circular cross section of the cylindrical ingot I.

The inner reflector 54 is also generally frustoconical, having a tapered main portion 74 and a mounting portion 76 extending generally vertically down from the bottom of the tapered main portion of the inner reflector. As illustrated in FIG. 1, the mounting portion 76 of the inner reflector 54 includes an annular lip 78 extending generally radially inward from the top of the mounting portion for seating on the support ledge 68 of the outer reflector 56. The inner reflector 54 thus rests on the support ledge 68 of the outer reflector 56, with the bottom of the mounting portion 76 of the inner reflector being spaced slightly above the lower flange 64 of the outer reflector 56.

The tapered main portion 74 of the inner reflector 54 slopes upward and outward from the mounting portion 76. The top of the inner reflector 54 is generally in flush alignment with the upper flange 58 of the outer reflector. In the preferred embodiment, the tapered main portion 74 of the inner reflector 54 is radially spaced a small distance from the outer reflector 56 so that the only contact between the inner and outer reflectors occurs where the lip 78 of the inner reflector seats on the ledge 68 of the outer reflector. The spacing also permits expansion and contraction of the outer reflector 56 upon being heated and cooled during operation of the puller without engaging and compressing the inner reflector 54. Spacing the inner reflector 54 from the outer reflector 56 in this manner reduces the amount of heat transferred from the outer reflector to the inner reflector. In the illustrated embodiment of FIGS. 1 and 3, the outer reflector 56 is shaped to define an annular insulation chamber 80 between the inner and outer reflectors. The insulation 52 is preferably constructed of a material having low thermal conductivity and is contained in the insulation chamber 80 to further insulate a portion of the inner reflector 54 against heat transfer from the outer reflector 56 to the inner reflector. The inner reflector 54 is in spaced relationship with the insulation 52 in the chamber 80 to inhibit heat transfer from the insulation to the inner reflector. The inner reflector 54 is preferably constructed of the same material as the outer reflector 56. However, it is understood that the inner and outer reflectors 54, 56 may be constructed of other materials without departing from the scope of this invention.

In operation, polycrystalline silicon is deposited in the crucible 20 and melted by heat radiated from the crucible heater 24. A seed crystal C is brought into contact with the molten silicon source material S and a single crystal ingot I is grown by slow extraction via the pulling mechanism 30. As the growing ingot I is pulled upward within the growth chamber 14, the crucible wall 34 is heated by the heater 24 and by the molten source material S in the crucible 20. Heat from the crucible wall 34 is transferred to the outer reflector 56 of the heat shield assembly 50. However, the insulation 52 in the insulation chamber 80 and the minimizing of direct contact between the inner and outer reflectors, 54, 56, inhibits heat transfer from the outer reflector to the inner reflector so that the inner reflector is substantially cooler than the outer reflector along substantially the entire length of the inner reflector. Spacing the inner reflector 54 from the insulation 52 further inhibits heat transfer from the insulation to the inner reflector. As the ingot I is pulled upward into radial registry with the cooler inner reflector 54, the heat is transferred from the ingot to the inner reflector more rapidly. Since the ingot I is cooled more rapidly, the pull rate of the crystal puller 10 can be substantially increased without distorting the growing ingot.

FIG. 3 illustrates a second embodiment of a heat shield assembly 150 of the present invention in which the outer reflector 156 is shaped similar to the inner reflector 154 and is arranged in parallel, spaced relationship with the inner reflector along substantially the entire length of the inner reflector. The insulation chamber 80 and insulation 52 of the first embodiment are omitted. The spacing between the inner and outer reflectors, 154, 156, inhibits the transfer of heat from the outer reflector to the inner reflector, thereby providing a cooler inner reflector along substantially the entire length of the inner reflector.

EXAMPLE 1

Crystal ingots having diameters of about 200 mm were grown in crystal pullers having heat shield assemblies constructed in accordance with either the prior art heat shield assembly A of FIG. 2 or the present invention heat shield assemblies 50, 150 of the first (FIG. 1) and second (FIG. 4) embodiments. A maximum pull rate was determined for each of the embodiments by measuring the fastest pull rate at which no distortion of the growing ingot occurred. The maximum pull rates when using the heat shield assemblies of the first and second embodiments of the present invention were 0.90 mm/min and 0.80 mm/min, respectively. This compares to a maximum pull rate of about 0.65 mm/min when using the prior art heat shield assembly A.

FIG. 4 illustrates a third embodiment of the present invention in which the heat shield assembly 250 is further constructed to achieve good GOI and to reduce or inhibit OISF while still increasing the pull rate over the maximum pull rate associated with the prior art heat shield assembly A. The inner reflector 254 has a length substantially shorter than that of the outer reflector 256 so that an upper portion 282 of the heat shield assembly 250 is defined by the outer reflector. An annular ring 262 constructed of a material having low thermal conductivity is seated on the ledge 268 of the outer reflector 256. The material is also preferably of high purity and low particle generation. A particularly preferred material is quartz. The lip 278 of the inner reflector 254 seats on the annular ring 262 rather than on the ledge 268 of the outer reflector 256 to further thermally isolate the inner reflector 254 from the outer reflector. The lower flange 264 of the outer reflector 256 is substantially thicker than that of the first and second embodiments to provide for increased heat transfer from the crucible to the bottom of the heat shield assembly 250. The lower flange 264 is substantially thicker than any other portion of the outer reflector 256 and preferably at least about twice as thick as the remainder of the outer reflector.

In operation, heat from the crucible wall 34 is transferred to the outer reflector 256 as the growing ingot I is pulled from the source material S. Spacing the inner reflector 254 from the outer reflector 256, as well as placing the annular ring 262 between the reflectors, inhibits heat transfer from the outer reflector to the inner reflector. Thus, a mid-portion 249 of the heat shield assembly 250, defined by the length of the inner reflector 254, is cooler than the exposed segments of the outer reflector 256 disposed above and below the inner reflector. The heat shield assembly 250 thus takes on a profile from bottom to top having a hotter zone at the bottom of the assembly, an intermediate cooler zone and a hotter zone again toward the top of the assembly.

As the growing ingot I is pulled upward from the source material S through a central opening (not shown, but similar to the central opening 72 of the first embodiment shown in FIG. 1) of the heat shield assembly 250, the ingot rises into radial registration with the cooler inner reflector 254 of the heat shield assembly. The ingot I thus cools more rapidly down to a temperature of about 1150° C. As the ingot I comes into registry with the portion of the outer reflector 256 extending above the inner reflector, the heat from the outer reflector inhibits further rapid cooling of the ingot, thereby substantially decreasing the axial temperature gradient of the ingot as the ingot cools down through a temperature range of about 1150° C.–1050° C.

Increasing the cooling rate of the ingot I above 1150° C. allows the pull rate to be increased without causing distortion of the growing ingot. Providing the hotter zone at the bottom of the heat shield inhibits cooling of the ingot I close to the surface of the source material S. This promotes a more uniform axial temperature gradient across the diameter of the ingot I at the melt surface, thereby inhibiting the growth of OISFs. Finally, providing a hotter zone towards the top of the heat shield assembly 250 reduces the cooling rate of the ingot I as it is pulled upward into registry with the hotter zone, thereby reducing the axial temperature gradient of the ingot as the ingot cools down from 1150° C. to 1050° C., improving GOI.

FIG. 5 illustrates a fourth embodiment of a heat shield 350 of the present invention similar to the third embodiment. In this fourth embodiment, the outer reflector 256 is shaped in a manner similar to the outer reflector 56 of the first embodiment (see FIG. 1) to define an insulation chamber 380. Insulation 352 similar to that discussed in relation to the first embodiment is contained in the insulation chamber 380. This embodiment provides a cooler mid-portion of the heat shield assembly 350 relative to the heat shield assembly 250 shown in FIG. 5.

EXAMPLE 2

Crystal ingots having diameters of about 200mm were grown in crystal pullers having heat shield assemblies constructed in accordance with the present heat shield assemblies of the third (FIG. 4) and fourth (FIG. 5) embodiments, 250 and 350 respectively. A maximum pull rate was determined for each of the embodiments by measuring the fastest pull rate at which no distortion of the growing ingot occurred. The maximum pull rate when using the heat shield assembly 250 of the third embodiment was about 0.70 mm/min. For the heat shield assembly 350 of the fourth embodiment, the maximum pull rate was about 0.80 mm/min. These rates compare to a maximum pull rate of about 0.65 mm/min when using a prior art heat shield assembly A as discussed above with respect to Example 1.

EXAMPLE 3

Crystal ingots having diameters of about 200 mm were grown in crystal pullers incorporating heat shield assemblies constructed in accordance with the present heat shield assembly 350 of the fourth embodiment and in accordance with the prior art heat shield assembly A. OISF was determined by locating a ring of defects caused by oxygen precipitates in the ingot and measuring the number of defects over a given area. Crystals grown using the prior art heat shield assembly A had an OISF ring located about 5 mm–10 mm radially inward from the peripheral edge of the ingot and an oxygen precipitate concentration 1000/cm$^2$. Crystals grown using the heat shield assembly 350 of the fourth embodiment had no measurable ring of defects and a total defect concentration of less than 1/cm$^2$.

In addition, the axial temperature gradients of the ingots were measured in the desired temperature range of 1150° C.–1050° C. The axial temperature gradient in this range for ingots grown using the prior art heat shield assembly A was about 0.74° C./mm, while the axial temperature gradient in this range for ingots grown using the heat shield assembly 350 of the fourth embodiment was 0.48° C./mm.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A crystal puller for producing a monocrystalline ingot, the crystal puller comprising:

a crucible for holding molten semiconductor source material;

a heater in thermal communication with the crucible for heating the crucible to a temperature sufficient to melt the semiconductor source material held by the crucible;

a pulling mechanism positioned above the crucible for pulling the ingot from the molten material held by the crucible; and a heat shield assembly disposed above the molten source material held by the crucible, the heat shield assembly having a central opening sized and shaped for surrounding the ingot as the ingot is pulled from the molten material, said heat shield assembly being generally interposed between the ingot and the crucible as the ingot is pulled upward from the source material within the crystal puller, said heat shield comprising an outer reflector and an inner reflector, the reflectors being shaped to define an insulation chamber therebetween for containing insulation, the inner reflector being supported in the puller in generally spaced relationship with the outer reflector and insulation along at least a portion of the inner reflector to inhibit heat transfer from the outer reflector and insulation to the inner reflector such that the spaced portion of the inner reflector is substantially cooler than the outer reflector during operation of the puller, the inner reflector being in contact relationship with the outer reflector generally adjacent the bottom of the outer reflector.

2. A crystal puller as set forth in claim 1 wherein the inner reflector is supported in the puller by the outer reflector, the inner reflector being seated on the outer reflector generally adjacent the bottom of the outer reflector, the inner reflector being substantially spaced from the outer reflector and insulation along substantially the entire length of the inner reflector above the bottom of the outer reflector to inhibit heat transfer between the outer reflector and the inner reflector such that substantially the entire length of the inner reflector is cooler than the outer reflector during operation of the puller.

3. A crystal puller as set forth in claim 1 wherein the inner reflector is supported in the puller by the outer reflector, the heat shield assembly further comprising a ring seated on the outer reflector generally adjacent the bottom of reflector, the inner reflector being seated on the ring such that the ring spaces the inner reflector from the outer reflector so that the inner reflector is substantially free of any engagement with the outer reflector and insulation, the ring being constructed of a material having a low thermal conductivity to inhibit heat transfer from the outer reflector to the inner reflector via the ring.

4. A crystal puller as set forth in claim 3 wherein the ring is constructed of quartz.

5. A crystal puller as set forth in claim 1 wherein the outer reflector extends substantially the entire length of the inner reflector.

6. A crystal puller as set forth in claim 1 wherein the inner reflector is substantially shorter than the outer reflector, the inner reflector being positioned relative to the outer reflector such that a portion of the outer reflector extends upward and outward beyond the inner reflector such that as an ingot is pulled upward from the source material into radial registry with the heat shield assembly the ingot is exposed to the cooler inner reflector to quickly cool the ingot, the ingot then being exposed to the hotter outer reflector as the ingot is pulled further upward to reduce the axial temperature gradient of the ingot.

7. A crystal puller as set forth in claim 6 wherein the length of the inner reflector is selected so that the crystal ingot has a temperature in the range of about 1150° C.–1050° C. when the ingot is in radial registry with the portion of the outer reflector extending upward and outward beyond the inner reflector, the hotter outer reflector reducing the axial temperature gradient of the ingot as the cools from approximately 1150° C. down to 1050° C. for use in decreasing the number of defects in the ingot.

8. A crystal puller as set forth in claim 6 wherein the inner reflector is further positioned relative to the outer reflector such that a lower portion of the outer reflector extends below the inner reflector in spaced relationship above the molten source material in the crucible, the ingot being exposed to the hotter lower portion of the outer reflector prior to coming into registry with the cooler inner reflector as the ingot is pulled upward from the molten source material, the hotter lower portion of the outer reflector promoting a uniform axial temperature gradient of the ingot as the ingot is pulled from the molten source material.

9. Apparatus as set forth in claim 1 wherein the inner reflector is movable relative to the outer reflector, the outer reflector having a lower flange extending generally radially inward adjacent the bottom of the outer reflector, the inner reflector being supported in the apparatus by the lower flange of the outer reflector.

10. A crystal puller for producing a monocrystalline ingot, the crystal puller comprising:

a crucible for holding molten semiconductor source material;

a heater in thermal communication with the crucible for heating the crucible to a temperature sufficient to melt the semiconductor source material held by the crucible;

a pulling mechanism positioned above the crucible for pulling the ingot from the molten material held by the crucible; and a heat shield assembly disposed above the molten source material held by the crucible, the heat shield assembly having a central opening sized and shaped for surrounding the ingot as the ingot is pulled from the molten material, said heat shield assembly being generally interposed between the ingot and the crucible as the ingot is pulled upward from the source material within the crystal puller, said heat shield assembly comprising an outer reflector and an inner reflector, the inner reflector being in contact relationship with a lower portion of the outer reflector generally in thermal engagement therewith, at least a portion of the remainder of the inner reflector being spaced from the outer reflector to define a gap therebetween, the gap being free of any material, to inhibit heat transfer between the outer reflector and said at least a portion of the remainder of the inner reflector so that said at least a portion of the remainder of the inner reflector is substantially cooler than the outer reflector during operation of the puller.

11. A heat shield assembly for use in a crystal puller for growing a monocrystalline ingot from molten semiconductor source material contained in a crucible in the crystal puller, the heat shield assembly comprising:

an outer reflector and an inner reflector, the reflectors being in generally coaxial alignment and having central openings sized and shaped for surrounding the ingot as the ingot is pulled from the molten material, said reflectors being generally interposed between the ingot and the crucible as the ingot is pulled upward from the source material within the crystal puller, said reflectors being shaped to define an insulation chamber therebetween for containing insulation, the inner reflector being supported in the puller in generally spaced relationship with the outer reflector and insulation along at least a portion of the inner reflector to inhibit heat transfer from the outer reflector and insulation to the inner reflector such that the portion of the inner reflector spaced from the outer reflector and insulation is substantially cooler than the outer reflector during operation of the puller, the inner reflector being in contact relationship with the outer reflector generally adjacent the bottom of the outer reflector.

12. A heat shield assembly as set forth in claim 11 wherein the outer reflector has a lower flange having a thickness greater than the thickness at any other location on the outer reflector for inhibiting heat loss in the crystal immediately adjacent to the melt.

13. A crystal puller for producing a monocrystalline ingot, the crystal puller comprising:

a crucible for holding molten semiconductor source material;

a heater in thermal communication with the crucible for heating the crucible to a temperature sufficient to melt the semiconductor source material held by the crucible;

a pulling mechanism positioned above the crucible for pulling the ingot from the molten material held by the crucible; and a heat shield assembly disposed above the molten source material held by the crucible, the heat shield assembly having a central opening sized and shaped for surrounding the ingot as the ingot is pulled from the molten material, said heat shield assembly being generally interposed between the ingot and the crucible as the ingot is pulled upward from the source material within the crystal puller, said heat shield comprising an outer reflector and an inner reflector, the reflectors being shaped to define an insulation chamber therebetween for containing insulation, the inner reflector being supported in the puller in generally spaced relationship with the outer reflector and insulation along at least a portion of the inner reflector to inhibit heat transfer from the outer reflector and insulation to the inner reflector such that the spaced portion of the inner reflector is substantially cooler than the outer reflector during operation of the puller;

the inner reflector being supported in the puller by the outer reflector, the heat shield assembly further comprising a ring seated on the outer reflector generally adjacent the bottom of the outer reflector, the inner reflector being seated on the ring such that the ring spaces the inner reflector from the outer reflector so that the inner reflector is substantially free of any engagement with the outer reflector and insulation, the ring being constructed of a material having a low thermal conductivity to inhibit heat transfer from the outer reflector to the inner reflector via the ring.

\* \* \* \* \*

UNITED STATES PATENT AND TRADEMARK OFFICE
CERTIFICATE OF CORRECTION

PATENT NO.   : 6,197,111 B1
DATED        : March 6, 2001
INVENTOR(S)  : Lee Ferry and Yasuhiro Ishii It is certified that error appears in the above-identified patent and that said Letters Patent is hereby corrected as shown below:

<u>Column 9, claim 7,</u>
Line 61, "as the cools" should read -- as the ingot cools --.

Signed and Sealed this

Ninth Day of April, 2002

*Attest:*

JAMES E. ROGAN
*Attesting Officer*   *Director of the United States Patent and Trademark Office*